(12) United States Patent
Yinanc et al.

(10) Patent No.: US 9,474,140 B2
(45) Date of Patent: Oct. 18, 2016

(54) ELECTROCHEMICAL TREATMENT OF HYDROCARBONS

(75) Inventors: Mehmet Derya Yinanc, Calgary (CA); Paul Daniel Harris, Calgary (CA)

(73) Assignee: Quantum Ingenuity Inc., Calgary, Alberta (CA)

( * ) Notice: Subject to any disclaimer, the term of this patent is extended or adjusted under 35 U.S.C. 154(b) by 0 days.

(21) Appl. No.: 14/007,043

(22) PCT Filed: Mar. 23, 2012

(86) PCT No.: PCT/CA2012/000259
§ 371 (c)(1),
(2), (4) Date: Sep. 24, 2013

(87) PCT Pub. No.: WO2012/126095
PCT Pub. Date: Sep. 27, 2012

(65) Prior Publication Data
US 2014/0014496 A1    Jan. 16, 2014

Related U.S. Application Data

(60) Provisional application No. 61/467,163, filed on Mar. 24, 2011.

(51) Int. Cl.
*H05H 1/24*    (2006.01)
(52) U.S. Cl.
CPC .... *H05H 1/2406* (2013.01); *H05H 2001/2412* (2013.01); *H05H 2245/121* (2013.01)

(58) Field of Classification Search
CPC .............. H05H 1/24; H05H 1/2406; H05H 2001/2412; H05H 2245/121; C01B 3/32; C01B 3/342; C01B 2203/0861; C01B 2203/0216; B01J 19/088; B01J 2219/0809; B01J 2219/082; B01J 2219/0828; B01J 2219/0835; B01J 2219/0839; B01J 2219/0841; B01J 2219/0849
See application file for complete search history.

(56) References Cited

U.S. PATENT DOCUMENTS

2004/0120887 A1*  6/2004  Sekine et al. ................ 423/650
2006/0060464 A1*  3/2006  Chang ........................... 204/164

OTHER PUBLICATIONS

Cheng et al "Liuid-phase non-thermal plasma technology for degradation of two high strength phenols in aqueous solution", Singapore International Water Week, Jun. 23, 2008.*

* cited by examiner

*Primary Examiner* — Xiuyu Tai
(74) *Attorney, Agent, or Firm* — Bennett Jones LLP

(57) ABSTRACT

Disclosed are methods and systems of producing plasma from a polar liquid under relatively benign conditions of temperature and pressure, by providing at least one dielectric medium in contact with the polar liquid, such that an interface forms between the liquid and the medium; and creating an electric potential across the interface to produce plasma from the polar liquid inside the dielectric medium. The plasma may be used to convert hydrocarbons into useful products or intermediates.

21 Claims, 3 Drawing Sheets

ELECTROCHEMICAL TREATMENT OF HYDROCARBONS

FIELD OF INVENTION

The subject matter described herein generally relates to a method and a system for producing plasma from a polar liquid and particularly relates to an electrochemical method of producing plasma from a polar liquids such as water, alcohol etc, inside a dielectric medium.

BACKGROUND

Plasma is essentially defined as a state of matter similar to gas in which a certain portion of the particles are ionized. Plasma contains charged particles such as positive ions, electrons, or negative ions. Ionization can be induced by various means, such as a strong electromagnetic field applied with a laser or microwave. The production of plasma inside any medium usually requires very harsh conditions. In general, electrical breakdown in liquid such as water and oil requires extremely high voltage and a very strong electric field.

The presence of plasma may allow various chemical reactions to take place at much lower temperatures than would otherwise be required. For example, it is known to use plasma in the gasification of municipal waste, biomass or other substances. The resultant mix of carbon monoxide and hydrogen gas can then be synthesized into synthetic fuels, using known processes.

Petroleum or crude oil is a naturally occurring mixture of hydrocarbons and smaller amounts of organic compounds containing heteroatoms such as sulfur, oxygen, nitrogen and metals, generally nickel and vanadium. The petroleum products obtained from processing crude oil may vary considerably according to market demand, crude oil quality, and refinery objectives. In current industrial practices, crude oils are distilled under atmospheric pressure and vacuum. The distillation fractions, including the residual fractions, may undergo further catalytic refining processes in order to produce high value products.

Varieties of physical and chemical processes are known to produce higher value hydrocarbon products. These processes include fractionation, isomerization, bond dissociation, reformation, purification and hydrogenation. These processes tend to require extreme conditions such as high pressures and temperatures, which are energy-intensive. Catalysts are usually employed in these processes for various reasons including, but not limited to, reducing the temperatures and pressures at which hydrocarbon conversion reactions take place. Attempts have been made to find new classes of catalysts or reactor types that would significantly lower the process parameters, while increasing the hydro processing efficiency but the progress made thus far is mostly small improvements over existing catalyst systems.

There have also been few attempts to utilize electrochemical means to hydro process petroleum streams. PCT Application No. WO2009/082467 A1 discloses a method for desulphurizing sulfur containing petroleum streams by utilizing an electrochemical apparatus. However, this method relies on the increased electro-conductive properties of bitumen at elevated temperatures or addition of electrolytes for other non-conductive liquids such as low sulfur automotive diesel oil ("LSADO"), as well as a hydrogenation catalyst.

Syngas contains varying amounts of carbon monoxide and hydrogen. Syngas is used as an intermediate in producing synthetic petroleum for use as a fuel or lubricant via the Fischer-Tropsch process and the Mobil methanol-to-gasoline process. Syngas consists primarily of hydrogen, carbon monoxide, and often some carbon dioxide. Although syngas has less than half the energy density of natural gas, syngas is combustible and often used as a fuel for internal combustion engines or as an intermediate for the production of other chemicals.

Syngas may be produced by various known methods, including steam reforming of natural gas or liquid hydrocarbons to produce hydrogen, the gasification of coal, biomass, and in some types of waste gasification facilities. These methods usually require extreme conditions, like high temperature and pressure. Syngas has also been produced from high temperature solid oxide fuel cells such as the method described in U.S. Patent Application No. 2008/002338 A1. However existing art suffers from many limitations. It requires use of purified carbon monoxide or dioxide and is incapable of handling any other feedstock. Water must be introduced as steam and must be preheated to a temperature between 500° C. and about 1200° C. Electrodes will participate in the reaction and will be reduced. Additionally, a high temperature environment will require specialized ceramic electrolyte compositions such as yttria stabilized zirconia.

In light of growing energy needs and the depletion of conventional energy sources, there is considerable effort being expended to devise new, efficient and green sources of energy; improve existing energy sources to provide more efficient energy sources; and improve methods of producing energy sources.

SUMMARY

The present invention relates to methods and systems of producing plasma from a polar liquid under relatively benign conditions of temperature and pressure. The plasma may be used to convert hydrocarbons into useful products or intermediates.

In one aspect, the invention may comprise a method of producing plasma from a polar liquid comprising the steps of:
  providing at least one dielectric medium in contact with the polar liquid, such that an interface forms between the liquid and the medium; and
  creating an electric potential across the interface to produce plasma from the polar liquid inside the dielectric medium.

In another aspect, the invention may comprise a method of processing a hydrocarbon feedstock by producing plasma from a polar liquid comprising the step of:
  providing the polar fluid in contact with the hydrocarbon feed stock, such that an interface forms between the polar fluid and hydrocarbon feedstock;
  creating an electric potential across the interface producing plasma from the polar liquid inside the hydrocarbon feedstock; and
  collecting any products obtained from the resulting hydrocarbon conversion.

In yet another aspect, the invention may comprise a method of producing hydrogen or carbon monoxide, or both hydrogen and carbon monoxide, comprising the steps of:
  providing a polar liquid in contact with a non-polar fluid, such that a interface forms between the polar and the non-polar fluid;

creating an electric potential across the interface of polar and non polar fluid, producing a plasma from the polar liquid in the non-polar fluid; and collecting any gaseous products obtained.

The present invention is also directed to an electrochemical system for producing plasma from a polar liquid comprising:

an electrochemical cell, comprising: a polar liquid, a dielectric medium, and a polar liquid-dielectric medium interface; and a power source for creating an electric potential across said interface.

The power source may be connected to electrodes suitably placed across the interface. In one embodiment, one electrode may be in contact with a conductive fluid which flows into the cell.

BRIEF DESCRIPTION OF DRAWINGS

These and other features, aspects, and advantages of the present invention will become better understood when the following detailed description is read with reference to the accompanying drawings in which like characters represent like parts throughout the drawings. The drawings are not necessarily to scale, with the emphasis instead placed upon the principles of the present invention. Additionally, each of the embodiments depicted are one of a number of possible arrangements utilizing the fundamental concepts of the present invention. The drawings are briefly described as follows.

DETAILED DESCRIPTION OF EMBODIMENTS OF THE INVENTION

Figure 1:
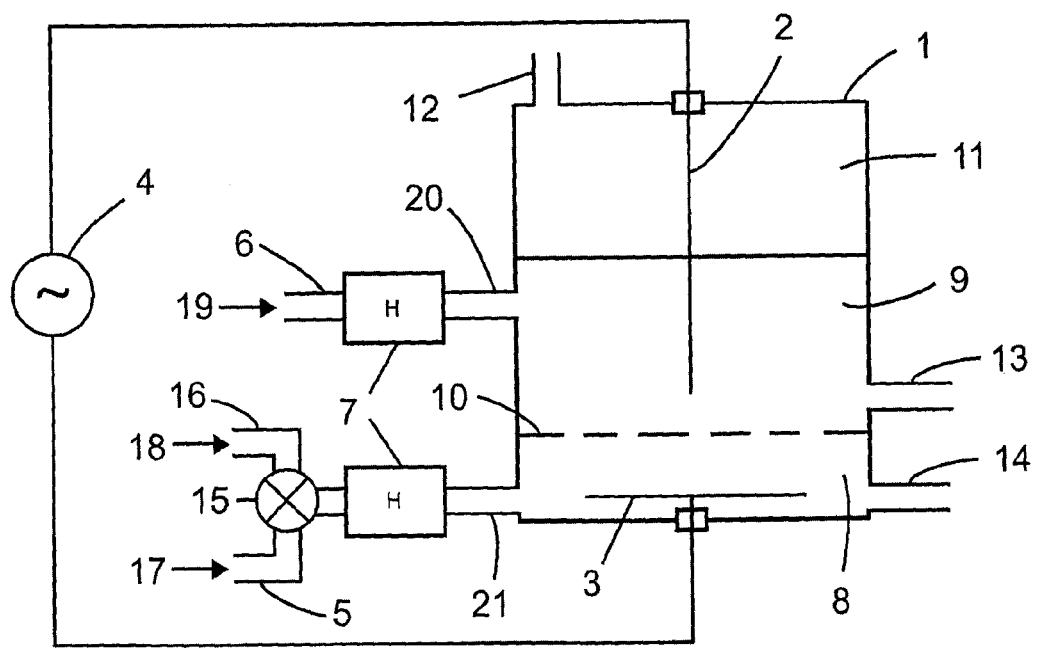
FIG. 1 is a schematic cross sectional view of one embodiment, showing a system employing high voltage electricity applied to electrodes placed in a polar (water) phase and a dielectric non-polar (hydrocarbon) phase to create an electric potential across the interface of polar and non polar fluid, thereby producing plasma from water inside the non-polar phase.

The subject matter described herein is directed to a method of producing plasma from a polar liquid comprising the steps of:

1. providing at least one dielectric medium in contact with the polar liquid, such that an interface forms between the polar liquid and the medium; and
2. creating an electric potential across the interface to produce plasma from the polar liquid inside said dielectric medium.

Any term or expression not expressly defined herein shall have its commonly accepted definition understood by those skilled in the art. As used herein, the terms "a" and "an" do not denote a limitation of quantity, but rather denote the presence of at least one of the referenced item.

In one embodiment, the electric potential is created by an alternating current power source connected to two electrodes on opposite sides of the dielectric medium/polar liquid interface. Without restriction to a theory, it is believed that the arcing of current between the two electrodes, across the interface, causes ionization and plasma formation. As a result, various chemical reactions and conversions take place in the dielectric medium and the polar liquid, and various products are produced.

As used herein, the term "dielectric" means a material which is an electrical insulator or which has poor electric conductivity, that can be polarized by an applied electric field. The dielectric medium may be a solid, liquid or a gas, or mixtures thereof.

As used herein, "plasma" means as a state of matter similar to gas in which a certain portion of the particles are ionized. Plasma contains charged particles such as positive ions, electrons or negative ions. Ionization can conventionally be induced by various means, such as by heat or a strong electromagnetic field applied with a laser or microwave. In general, electrical breakdown in a liquid such as water or oil requires extremely high voltage and a strong electric field.

In one embodiment, the electric potential is created by a high voltage alternating current, which may be in the range of from about 500 V to about 30 KV.

In another embodiment, the electric potential may be created by a pulsed DC voltage source. Without restriction to theory, it is believed that rapid oscillation of polarity, or rapid pulsing of voltage, aids in plasma formation.

The dielectric medium and the polar liquid may be combined in different combinations and are chosen to create an interface between the two. For example, the interface may be a gas/liquid interface, or it may be the interface between two immiscible liquids. In one embodiment, the polar liquid may comprise water, while the dielectric medium may comprise a non-polar fluid which is substantially immiscible with water. In another embodiment, the polar liquid may comprise an alcohol, while the dielectric medium comprises a gas, which may be air or a relatively inert gas such as nitrogen. Other combinations of the dielectric medium and the polar liquid are within the scope of the present invention.

In one embodiment, the polar liquid is a liquid under standard ambient conditions, and may comprise water, an alcohol, hydrogen peroxide, a polyol such as glycerol, a diol such as ethylene glycol, propanediol or butanediol, a ketone such as acetone or butanone (methyl ethyl ketone or MEK), or mixtures thereof. The alcohol may be a primary, secondary or tertiary alcohol. In one embodiment, the alcohol comprises methanol, ethanol, propanol or isopropanol, or butanol. In another embodiment, the polar liquid may be comprised in a semi-solid form such as a gel, or a solid form, such as ice or other frozen or partially frozen forms of the polar liquid.

The polar liquid may further comprise an electrolyte to enhance electrical conductance through the polar liquid. The electrolyte may comprise a salt, an alkali, an organic acid, a mineral acid, or mixtures thereof. In one embodiment, the electrolyte comprises sodium hydroxide, potassium hydroxide, sodium chloride, sodium carbonate, calcium carbonate, acetic acid, citric acid, hydrochloric acid, or sulphuric acid. Without restriction to theory, it is believed that the electrolyte enables freer electron flow inside the polar liquid, enabling easier ionization of plasma. Furthermore, the choice of electrolyte may modify the plasma type and the resulting reactions by introducing ionic species specific to the electrolyte in question. The type of electrolyte hence can also be selected based on the type of reaction desired in the plasma and the ionic species that would be required in said reaction.

In one embodiment, the polar liquid may further comprise a plasma enhancer comprising a carbohydrate, such as a mono- or di-saccharide or a sugar alcohol. Without restriction to a theory, the plasma enhancer may undergo rapid oxidation during the plasma formation process, releasing heat, carbon dioxide and/or water. In one embodiment, the plasma enhancer may comprise sucrose, glucose, fructose, sorbitol, mannitol, or glycol.

In one embodiment, the electric potential is created across the polar liquid/dielectric medium interface by creating an electric potential between;
 a first electrode placed in or near the dielectric medium on one side of the interface; and
 a second electrode placed in contact with the polar liquid on the other side of the interface.

Either or both electrodes may comprise a conductive material such as tungsten, copper, or graphite. The electrode is preferably non-reactive with the dielectric medium or the polar liquid.

The dielectric medium may be a solid, semi-solid, liquid or a gas under standard ambient conditions. In one embodiment, the dielectric medium is a non-polar liquid, which is immiscible with the polar liquid, thereby creating a phase separation boundary. In another embodiment, the dielectric medium may be a gas. The dielectric medium may combine phases, such as a fluid colloidal suspension, a semi-solid gel, or a gas entrained in a liquid.

In one embodiment, the dielectric medium comprises a non-polar fluid comprising a hydrocarbon feedstock. The hydrocarbon feedstock may comprise any liquid hydrocarbon, or hydrocarbon which is normally liquid under standard ambient conditions. Therefore, the non-polar fluid may comprise kerosene, diesel oil, mineral oil, crude oil or a crude oil fraction, a vegetable oil, or mixtures thereof.

Without restriction to a theory, it is believed that the electric potential applied across the phase separation boundary, creates a plasma from the polar liquid which then extends through the dielectric medium to provide a conductive path to the first electrode. As a result, various chemical reactions or conversions may take place in the dielectric medium. In an embodiment where the dielectric medium comprises a hydrocarbon, various lighter hydrocarbon products may be produced, as well as relatively large amounts of hydrogen and carbon monoxide may be produced. In addition, amorphous carbon and nano-structured carbon such as graphite, graphene, nanotubes and fullerenes may be produced.

The production of plasma from the practice of the present invention does not require high temperatures or pressures. In embodiments described herein, the reactions may occur under standard ambient conditions (25° C., atmospheric pressure). In one embodiment, either or both the polar liquid and the dielectric medium may be heated, but it is not necessary to heat either phase beyond its boiling point, although that may be desirable in some instances. In one example, either or both the polar liquid and the dielectric medium are heated to between about 30° C. to about 80° C.

Embodiments of the present invention can be utilized in substitution for or in addition to existing processes that traditionally used catalytic hydroprocessing. In particular, the method may be used to upgrade bitumen or heavy oil (API gravity of below about 22°) or to upgrade or fractionate crude oil into higher value products. For example, the method may be used to process kerosene, diesel, mineral oil, naphtha, n-heptane, crude oil, residual oil or other crude oil fractions, or bitumen.

The methods of the present invention may provide a method of hydroprocessing hydrocarbons, creating lighter or more valuable products in an efficient manner. The term "hydroprocessing" refers to those processes in which hydrogen is used to process hydrocarbons, including but not limited to hydrogenation, hydrocracking and hydrotreating processes.

In one embodiment, a solid hydrocarbon to be processed may be dispersed in the dielectric phase, or the polar liquid phase. For example, powdered coal or coke, or asphaltene particles, may be suspended in the dielectric phase. Some portion of the dispersed solid hydrocarbon particles may settle onto the dielectric/polar liquid interface, but surface tension will typically prevent entry into the polar liquid phase. These particulate hydrocarbons may be processed or converted by the plasma production.

In one embodiment, conventional hydroprocessing catalysts, such as iron or nickel in metallic or oxide forms may be employed. The catalyst may be well dispersed in powder form in the hydrocarbon phase. If the catalyst particles settle somewhat, they may gather at the phase separation boundary and some amount of catalyst may enter the polar phase. However, that does not appear to affect the performance of the system.

The present invention can be used for producing syngas comprising the steps of:
 a. providing a polar liquid in contact with the hydrocarbon feedstock, such that a interface forms between the polar fluid and hydrocarbon feedstock;
 b. creating an electric potential across the interface of hydrocarbon feedstock with a polar fluid; and
 c. collecting any gaseous products obtained.

The methods of the present invention may be practiced on a batch basis, or a continuous flowing basis. In one embodiment, either or both the dielectric medium or the polar liquid phases may be continuously streamed through an electrolytic cell. Optionally, either or both the hydrocarbon and polar phases may be heated prior to entering the cell. All or a portion of the hydrocarbon stream may be recirculated back into the cell, and may be heated in such a recirculation loop. Additionally, all or a portion of the polar liquid may be recirculated back into the cell. In any recirculation loop, any solids may be filtered or removed, and the liquid may be degassed.

In one aspect, a method of the present invention may be carried out in a system as schematically depicted in FIG. 1, comprising an electrically insulated electrochemical cell (1), through which a hydrocarbon feed stream (19) passes through an inlet (6). In one embodiment, a heating system (7) feeds into electrochemical cell (1) through an inlet (20). The polar phase feed (17) feeds through an inlet (5). An optional electrolyte mixing valve (15) mixes the polar phase feed (17) and electrolyte (18) and may feed in through an inlet (16), which may pass through heating system (7) and through inlet (21). A power source (4) is connected to electrodes (2, 3) inside the electrochemical cell (1).

When a suitable dielectric medium (9) and a polar liquid (9) are present in the cell (1), a phase boundary (10) is formed. An outlet (13) allows any hydroprocessed hydrocarbon feed stream in with solid phase carbon based products and other byproducts to leave the electrochemical cell (1). A byproduct outlet (14) allows the aqueous layer and byproducts in the aqueous layes to leave the electrochemical cell (1). A gas outlet (12) allows the gaseous products (11) to leave the reactor.

In another aspect of the present invention the electric potential is created across a first polar liquid/dielectric medium interface by creating an electric potential between;
a dielectric electrode on one side of the interface, comprising a stream of electrode polar fluid flowing through the dielectric medium; and
a second electrode in contact with the first polar liquid on the other side of the interface.

In one embodiment, the electrode polar fluid is the same as or different from the first polar liquid. Therefore, the electrode polar fluid may comprise water, a primary, secondary or tertiary alcohol, hydrogen peroxide, glycerol or mixtures thereof, or a solid form of the polar fluid such as ice. In one embodiment, the second polar fluid comprises methanol, ethanol, propanol, isopropanol, acetone, or butanone (MEK). The electrode polar fluid may further comprise an electrolyte, in a like manner to the first polar liquid electrolyte described above.

Without limitation to a theory, it is believed that the streaming polar fluid allows extension of plasma lifetime and may focus the plasma into the electrode polar fluid stream. This allows plasma to react with components in the electrode polar fluid. In one embodiment, the electrode polar fluid may comprise a solid hydrocarbon feedstock, such as powdered coal or coke, or particulate asphaltenes, suspended in the fluid. The plasma is formed inside the dielectric medium, and the presence of ionized electrode polar fluid stream provides a conductive path, analogous to a wave guide, for the plasma after its formation. The plasma may cause conversion of any component of the dielectric medium, or in the polar liquid phase.

The streaming polar fluid will pass through the dielectric medium, and if denser, it will combine with the polar liquid phase. If a solid phase is in the streaming polar fluid, unreacted particles will be present in the polar liquid phase and may be recirculated as described above.

Figure 3:
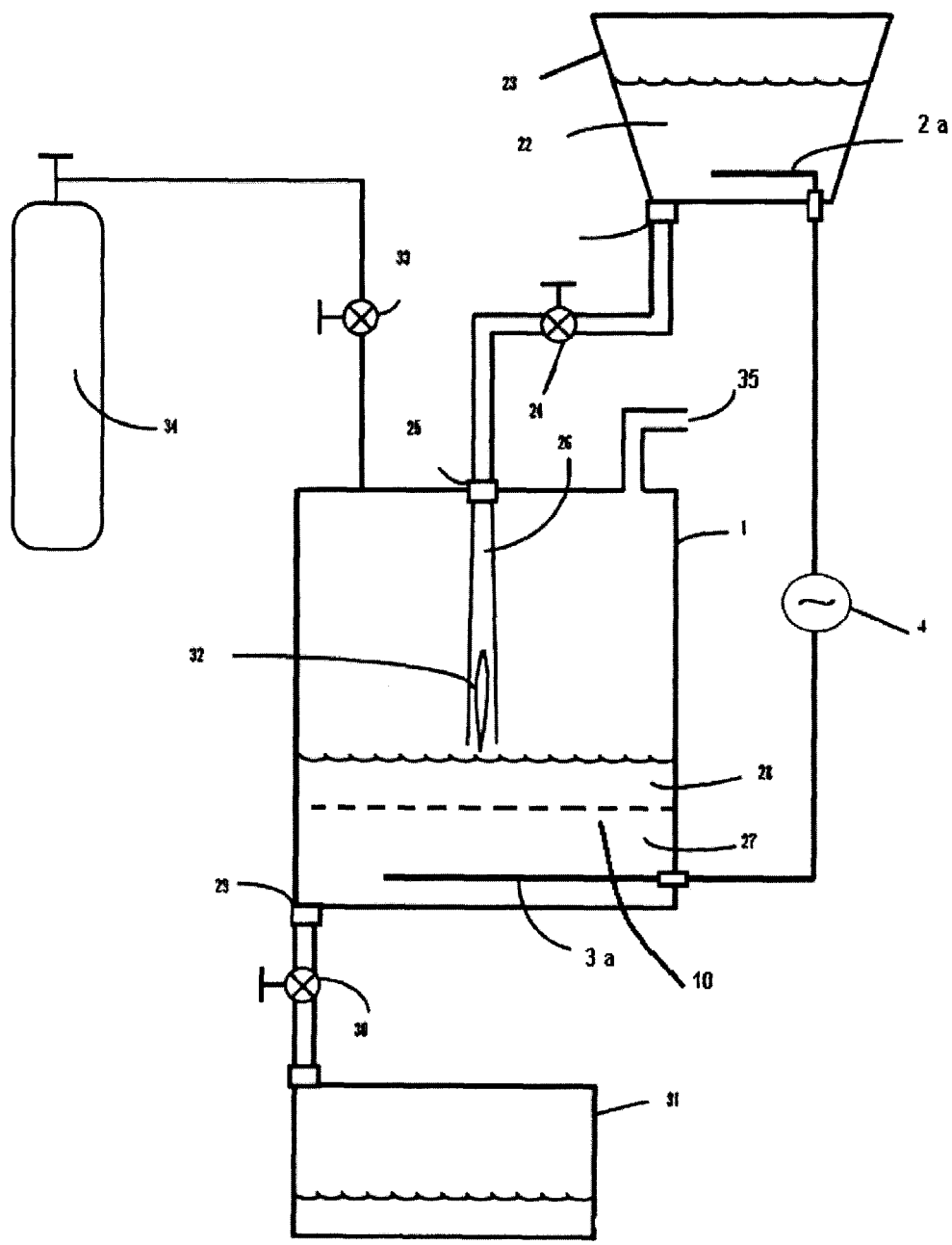
FIG. 3 is a schematic cross sectional view of one embodiment of the present invention, showing an apparatus employing high voltage electricity applied to electrodes placed in flowing water (second polar liquid) and lower water phase (polar liquid) with a lighter non-polar phase placed in contact with a lower water phase to form the interface.

In one aspect, the method may be carried out by system as depicted in FIG. 3. An electrically insulated reactor (1) is fed water and NaOH feed stream (22) from a source holding vessel (23) through a valve (24) and an inlet (25) to create a flowing stream (26) within a reactor (1). A high voltage alternating current power source (4) is connected to an electrode in feed water (2a) within a source holding vessel and an electrode (3a) in a lower water phase (27) within a reaction chamber (1). Above the lower water phase, floats a less dense non-polar phase (28) which is substantially immiscible with the water phase. A phase boundary (10) forms between the lower water phase (27) and non polar phase (28). The lower water phase can leave the reaction chamber (1) through outlet (29) and valve (30) into lower water holding tank (31) where it is contained.

Power is supplied by power source (4) while feed water stream within the reaction chamber is descending into the non-polar phase (28). Plasma (32) may occur within the water stream producing gases which can exit through gas outlet (35). Prior to operation, reaction chamber (1) may be flushed with inert gas (34) through valve (33).

EXAMPLES

Example 1

The electrochemical cell used in Examples 1-4 was a common ducted cell wherein the two electrodes were placed one in each of the liquid phases. The dielectric hydrocarbon phase comprised 1-K grade kerosene. The denser and polar lower liquid phase consisted of 200 ml of deionized water, to which was added 0.3 grams of sodium hydroxide (NaOH). The bottom electrode consisted of a 5 cm long, 14 AWG copper wire positioned near the bottom of the lower liquid phase. The dielectric medium was a liquid phase consisting of 200 ml of kerosene and submerged into it was a 4 mm diameter tungsten electrode partially insulated, with a 1.2 cm exposed tip. The tungsten electrode was positioned from above into the centre of the electrochemical cell and the tip was held in place approximately 1 cm above the phase separation boundary between the two liquid phases. Electrical potential was supplied by a 15 kV 30 mA AC neon sign transformer regulated by a 120V autotransformer. Electrochemical operation was conducted for 30 minutes at 15 000 volts.

Example 2

In this example, the polar liquid phase consisted of 200 ml of methanol to which was added 0.3 grams of sodium hydroxide. The bottom electrode consisted of a 5 cm long 14 AWG copper wire positioned at the bottom of the methanol phase. The dielectric upper liquid phase consisted of 200 ml of diesel fuel and submerged into it was a 4 mm diameter Tungsten electrode partially insulated with 1.2 cm exposed tip, this electrode was positioned from above into the centre of the electrochemical cell and the tip was held in place 1 cm above the phase separation boundary between the two liquid phases. Electrical potential was supplied by a 15 kV 30 mA AC neon sign transformer regulated by a 120V autotransformer. Electrochemical operation was conducted for 30 minutes at 15 000 volts.

Example 3

In this example, the dielectric medium consisted 200 ml of a low sulphur diesel fuel, while the polar fluid consisted of 200 ml of glycerol to which was added 0.3 grams of sodium hydroxide mixed with 10 ml of deionized water. Electrical potential was supplied by a 15 kV 30 mA AC neon sign transformer regulated by a 120V autotransformer. Electrochemical operation was conducted for 30 minutes at 15 000 volts.

Figure 2:
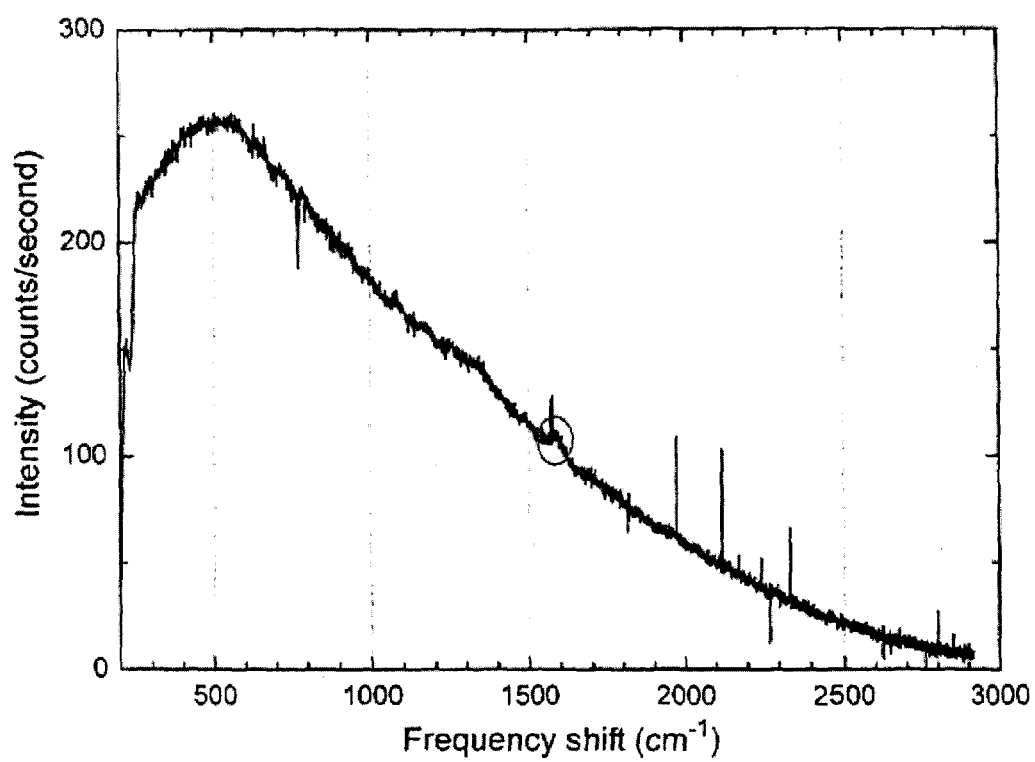
FIG. 2 is a Raman spectrograph of a solid phase material recovered from a treated hydrocarbon phase by employing the system of FIG. 1.

In each of Examples 1-3, gas evolution was observed immediately and a solid phase emerged in the dielectric hydrocarbon phase. The solid phase was determined to comprise metals, and carbon structures such as carbon nanotubes and fullerenes, along with amorphous carbon and graphene. The presence of carbon structures was indicated by Raman spectroscopy as shown in FIG. 2.

Example 4

200 ml of n-heptane as the dielectric and 200 ml of water as the polar liquid was run in the electrochemical cell, as described in Example 1 above. As power was applied, a sample of the gas evolving from the hydrocarbon phase was captured and analyzed. The resulting composition of the gas phase and the remaining liquid hydrocarbon phase is shown below in Table 1:

TABLE 1

Detailed gas analysis of the gas phase evolving from the electrochemical cell of example 4

| Analyte Detailed Gas Analysis | Mole % | ppmv Mole ppm | mg/m³ | Detection Limit Mole ppm |
|---|---|---|---|---|
| Hydrogen | 47.54 | | | |
| Helium | <0.01 | | | |
| Argon (calculated) | 0.05 | | | |
| Oxygen | 1.09 | | | |
| Nitrogen | 3.77 | | | |
| Carbon Monoxide | 9.43 | | | |
| Carbon Dioxide | 0.58 | | | |
| Hydrogen Sulfide | <0.01 | | | |
| Methane | 5.19 | | | |
| Ethane | 0.61 | | | |
| Ethylene | 11.71 | | | |
| Acetylene | 16.49 | | | |
| Other C3s | | 6690 | | |
| Propane | | <1 | | |
| Other C4s | | 2390 | | |
| Iso-Butane | | 5 | | |
| Other C6s | | | 144 | |
| n-Hexane | | | 1 | |
| Methylcyclopentane | | | <1 | |
| Benzene | | | 87 | |
| Cyclohexane | | | 2 | |
| Other C7s | | | 175 | |
| n-Heptane | | | 25000 | |
| Methylcyclohexane | | | 112 | |
| Toluene | | | 7 | |
| Other C8s | | | 4 | |
| n-Octane | | | <1 | |
| Ethylbenzene | | | <1 | |
| m&p Xylene | | | 1 | |
| o-Xylene | | | <1 | |
| Other C9s | | | <1 | |
| n-Nonane | | | <1 | |

TABLE 1-continued

Detailed gas analysis of the gas phase evolving from the electrochemical cell of example 4

| Analyte Detailed Gas Analysis | Mole % | ppmv Mole ppm | mg/m³ | Detection Limit Mole ppm |
|---|---|---|---|---|
| n-Butane | | 690 | | |
| Other C5s | | 244 | | |
| iso-Pentane | | 9 | | |
| n-Pentane | | 6 | | |
| Decanes+ (C10+) | | | | 1 |

As shown in Table 1, the gas phase was predominantly hydrogen and carbon monoxide. The liquid phase was predominantly n-heptane. Minor amounts of C1-C6 compounds were detected in both the gas and liquid phases.

Example 5

200 ml of bitumen as the dielectric was placed with 200 ml of water as the polar liquid in an electrochemical cell as described above in Example 1. As power was applied, a sample of the gas evolving from the hydrocarbon phase was captured and analyzed. The resulting composition of the gas phase and the remaining liquid hydrocarbon phase is shown below in Table 2:

TABLE 2

Detailed gas analysis of the gas phase evolving from the electrochemical cell of example 5
Analytical Report

| Bill To: | Quantum Ingenuity Inc. | Project ID: | | Lot ID: | 759341 |
|---|---|---|---|---|---|
| Report To: | Quantum Ingenuity Inc. | Name: | | Control Number: | A175969 |
| | 706, 321-10 Street NW | Location: | | Date Received: | Aug. 26, 2010 |
| | Calgary, AB, Canada | LSD: | | Date Reported: | Sep. 2, 2010 |
| | T2N 1V7 | P.O.: | | Report Number: | 1352661 |
| Attn: | Accounts Payable | | | | |
| Sampled by: | | | | | |
| Company: | | | | | |

| Exove Number: | 759341-1 | Analysis Date: Aug. 27, 2010 |
|---|---|---|
| Sample Date: | Aug. 26, 2010 | |
| Sample Description: | QI-4 | |

| Analyte Detailed Gas Analysis - Air Free | Mole % | ppmv Mole ppm | mg/m³ | Detection Limit Mole ppm |
|---|---|---|---|---|
| Hydrogen | 38.86 | | | |
| Helium | <0.01 | | | |
| Argon (calculated) | — | | | |
| Oxygen | — | | | |
| Nitrogen | 7.60 | | | |
| Carbon Monoxide | 22.06 | | | |
| Carbon Dioxide | 11.17 | | | |
| Hydrogen Sulfide* | 1.94 | | | |
| Methane | 3.33 | | | |
| Ethane | 0.28 | | | |
| Ethylene | 2.76 | | | |
| Acetylene | 5.52 | | | |
| Other C3s | | 9480 | | |
| Propane | | <1 | | |
| Other C4s | | 3640 | | |
| Iso-Butane | | 1920 | | |
| n-Butane | | 1240 | | |
| Other C5s | | 923 | | |
| iso-Pentane | | 6960 | | |
| n-Pentane | | 501 | | |
| Other C6s | | | 2340 | |
| n-Hexane | | | 599 | |
| Methylcyclopentane | | | 590 | |
| Benzene | | | 10200 | |
| Cyclohexane | | | 684 | |
| Other C7s | | | 2440 | |
| n-Heptane | | | 1170 | |
| Methylcyclohexane | | | 1080 | |
| Toluene | | | 3390 | |
| Other C8s | | | 3520 | |
| n-Octane | | | 889 | |
| Ethylbenzene | | | 468 | |
| m&p Xylene | | | 985 | |
| o-Xylene | | | 282 | |
| Other C9s | | | 3260 | |
| n-Nonane | | | 405 | |
| Decanes+ (C10+) | | | 7790 | |

*H2S content measured using GasTec tube.

As shown in table 2 above, the gas phase was found to be predominantly hydrogen and carbon monoxide. Other C1 to C10 compounds were also found as shown in Table 2.

Example 6

An electrically insulated reaction chamber was fed water and NaOH feed stream from a source holding vessel through a valve and an inlet to create a flowing stream within the reactor. A high voltage alternating current power source was connected to an electrode in the feed water within the source holding vessel and a lower water phase within the reaction chamber. Above the lower water phase, was placed 100 ml of a lighter non-polar kerosene phase. Electrical potential was supplied by a 15 kV 30 mA AC neon sign transformer regulated by a 120V autotransformer while the water stream within reaction chamber is descending into the non-polar kerosene phase. Plasma occurred within the water stream, producing gases. Prior to operation, reaction chamber is flushed with inert gas. The gas phase was found to be predominantly hydrogen and carbon monoxide.

Example 7

An electrically insulated reaction chamber contained 300 milliliters of methanol and 0.5 grams of NaOH. A high voltage alternating current power source was connected to a tungsten electrode suspended 2 cm above the methanol and the other copper electrode was placed in contact with the methanol within the reaction chamber. The chamber was flushed with nitrogen. Electrical potential was supplied by a 15 kV 30 mA AC neon sign transformer regulated by a 120V autotransformer. Methanol and other soluble ions crossed the interface turning into plasma and gas evolution was observed. The gases were found to be predominantly hydrogen and carbon monoxide.

Although the invention has been described with reference to specific embodiments, this description is not meant to be construed in a limiting sense. Various modifications of the disclosed embodiments, as well as alternate embodiments of the invention, will become apparent to persons skilled in the art upon reference to the description of the invention. It is therefore contemplated that such modifications can be made without departing from the spirit or scope of the present invention as defined.

What is claimed:

1. A method of producing gaseous products by producing plasma from a polar liquid comprising the steps of:
    a. providing at least one dielectric medium comprising a hydrocarbon in contact with the polar liquid, such that an interface forms between the polar liquid and the medium; and
    b. creating an electric potential of about 15 kV to about 30 kV across the interface with a first electrode in contact with or near the dielectric medium and a second electrode in contact with the polar liquid, to produce plasma from the polar liquid inside said dielectric medium wherein the plasma passes through the dielectric medium; and
    c. collecting gaseous products including acetylene from the dielectric medium.

2. The method as claimed in claim 1, wherein the electric potential is created by an alternating current.

3. The method as claimed in claim 1, where in the dielectric medium is a second liquid.

4. The method of claim 1 wherein either or both the dielectric medium and the polar liquid comprises a dispersed solid hydrocarbon.

5. The method as claimed in claim 1, wherein the dielectric medium comprises kerosene, diesel, mineral oil, a crude oil or crude oil fraction, a vegetable oil, or mixtures thereof.

6. The method as claimed in claim 1, wherein the polar liquid comprises water, a primary, secondary or tertiary alcohol, hydrogen peroxide, glycerol or mixtures thereof.

7. The method as claimed in claim 1, wherein the polar liquid comprises an electrolyte comprising a salt, an alkali, an organic acid, a mineral acid, or mixtures thereof.

8. The method as claimed in claim 1, wherein the polar liquid further comprises a plasma enhancer comprising a carbohydrate or a sugar alcohol.

9. The method as claimed in claim 1, wherein either one or both of the polar liquid and the dielectric medium is heated prior to creating the electric potential across the interface of said polar liquid and said medium.

10. The method as claimed in claim 1, wherein the polar liquid is in a solid or semi-solid form.

11. The method as claimed in claim 1, wherein the first electrode comprises a stream of a second polar fluid, flowing into the dielectric medium, wherein the second polar fluid is the same as or different than the polar fluid.

12. The method as claimed in claim 11, wherein the second polar fluid comprises water, an alcohol, hydrogen peroxide, glycerol or mixtures thereof.

13. The method as claimed in claimed in claim 11, wherein the second polar fluid further comprises an electrolyte.

14. The method as claimed in claim 11, wherein second polar fluid comprises a dispersed solid hydrocarbon.

15. The method as claimed in claim 1, wherein the dielectric medium is a gas and the polar liquid comprises an alcohol.

16. The method as claimed in claim 1, wherein the electric potential across the interface is created by producing a potential difference between a first electrode in contact with or near the hydrocarbon feedstock on one side of the interface and second electrode in contact with the polar liquid on the other side of the interface.

17. The method as claimed in claim 1, wherein the polar fluid comprises water, an alcohol, or hydrogen peroxide, or mixtures thereof.

18. The method as claimed in claim 1, wherein the polar fluid further comprises an electrolyte.

19. The method as claimed in claim 1 further comprising the step of producing gaseous products comprising hydrogen or carbon monoxide, or both hydrogen and carbon monoxide by collecting the gaseous products evolved from the hydrocarbon feedstock as a result of a conversion of the hydrocarbon feedstock caused by the plasma.

20. The method as claimed in claim 19, wherein the electric potential across the interface is created by producing a potential difference between a first electrode in contact with or near the dielectric medium on one side of the interface and a second electrode in contact with the polar liquid on the other side of the interface.

21. The method as claimed in claim 20, wherein the first electrode is a stream of a second polar fluid flowing into the dielectric medium.

* * * * *